United States Patent [19]

Cortiula

[11] Patent Number: 5,508,646
[45] Date of Patent: Apr. 16, 1996

[54] CONTROLLED FEEDBACK CHARGE-TO-VOLTAGE CONVERTER

[75] Inventor: Jean-Alain Cortiula, Claix, France

[73] Assignee: Thomson-CSF Semiconducteurs Specifiques, Paris, France

[21] Appl. No.: 272,783

[22] Filed: Jul. 8, 1994

[30]     Foreign Application Priority Data

Jul. 9, 1993  [FR]  France ................... 93 08468

[51] Int. Cl.⁶ ................................. H02M 11/00
[52] U.S. Cl. ................ 327/103; 377/59; 377/60; 377/63
[58] Field of Search ............... 257/239; 327/103, 327/271, 277, 284; 333/165; 341/172; 348/250; 377/60, 63, 59

[56]            References Cited

U.S. PATENT DOCUMENTS

| | | | |
|---|---|---|---|
| 4,974,239 | 11/1990 | Miwada | 377/63 |
| 5,276,723 | 1/1994 | Miwada | 377/60 |
| 5,280,511 | 1/1995 | Fujii et al. | 377/60 |
| 5,287,393 | 2/1995 | Miwada | 257/239 |

FOREIGN PATENT DOCUMENTS

| | | |
|---|---|---|
| 0069072 | 6/1982 | European Pat. Off. . |
| 0495500 | 1/1992 | European Pat. Off. . |
| 59-126379 | 7/1984 | Japan . |
| 3297287 | 12/1991 | Japan . |

*Primary Examiner*—Timothy P. Callahan
*Assistant Examiner*—Jeffrey Zweizig
*Attorney, Agent, or Firm*—Roland Plottel

[57]            ABSTRACT

The invention concerns a charge-to-voltage converter including a read diode and a read transistor of no-load gain $G_o$. The converter includes complementary circuits assuring a conversion gain greater than Go during read periods and a conversion gain substantially equal zero at other times.

12 Claims, 4 Drawing Sheets

5,508,646

CONTROLLED FEEDBACK CHARGE-TO-VOLTAGE CONVERTER

BACKGROUND OF THE INVENTION

The present invention concerns a charge-to-voltage converter. These are used, for example, in charge-transfer devices.

A charge-to-voltage converter comprises a read diode and a read amplifier. The diode has a diffusion capacitance Cd and the amplifier has a gain G. Professionals of the art will know that the characteristic parameter of a charge-to-voltage converter is its so-called conversion factor which relates the output voltage to the input charge.

The theoretical value of the conversion factor is FCC=G/Cd.

However, owing to the existence of parasitic capacitances acting in parallel with the diffusion capacitance Cd (overlapping capacitance Cr of the diode, and the Miller capacitance Cm fed back to the input of the amplifier), the conversion factor is more correctly given by the relation:

FCC=G/(Cd+Cr+Cm)

According to the prior art, the gain G is adjusted using a resistance R outside the component constituting the charge-transfer device. This resistance fixes the gain, the base width and the noise in the read chain, which includes, in addition to the charge-to-voltage converter, another amplifier followed by a low-pass filter, which in turn is followed by a double correlated sampling circuit.

Such a device has a number of disadvantages. In particular, owing to the poor gain of the conversion stage, the complete chain has non-optimized noise characteristics because most of the amplification is achieved after the read amplification. This problem becomes serious in applications involving processing of signals of low amplitude.

The present invention overcomes these problems.

SUMMARY OF THE INVENTION

The object of the invention is a charge-to-voltage converter including a read diode and a read amplifier, the latter including a transistor whose gate electrode is connected to the read diode and whose source provides the point at which the output voltage of the device appears. This transistor assures a no-load gain $G_o$ between the tension on its gate and that on its source. The converter is characterized by the fact that the read amplifier includes supplementary means enabling it to provide a gain G greater than $G_o$ during the read phases.

These supplementary means, described later, comprise a current generator controlled by an amplifier.

One immediate advantage of the invention is therefore to reduce the noise factor of the read chain.

BRIEF DESCRIPTION OF THE DRAWINGS

Other characteristics and advantages of the present invention will become apparent on read the following description of a preferred embodiment, with reference to the attached drawings.

In all the figures the same references refer to the same components.

DESCRIPTION OF THE PREFERRED EMBODIMENT OF THE INVENTION

Figure 1:
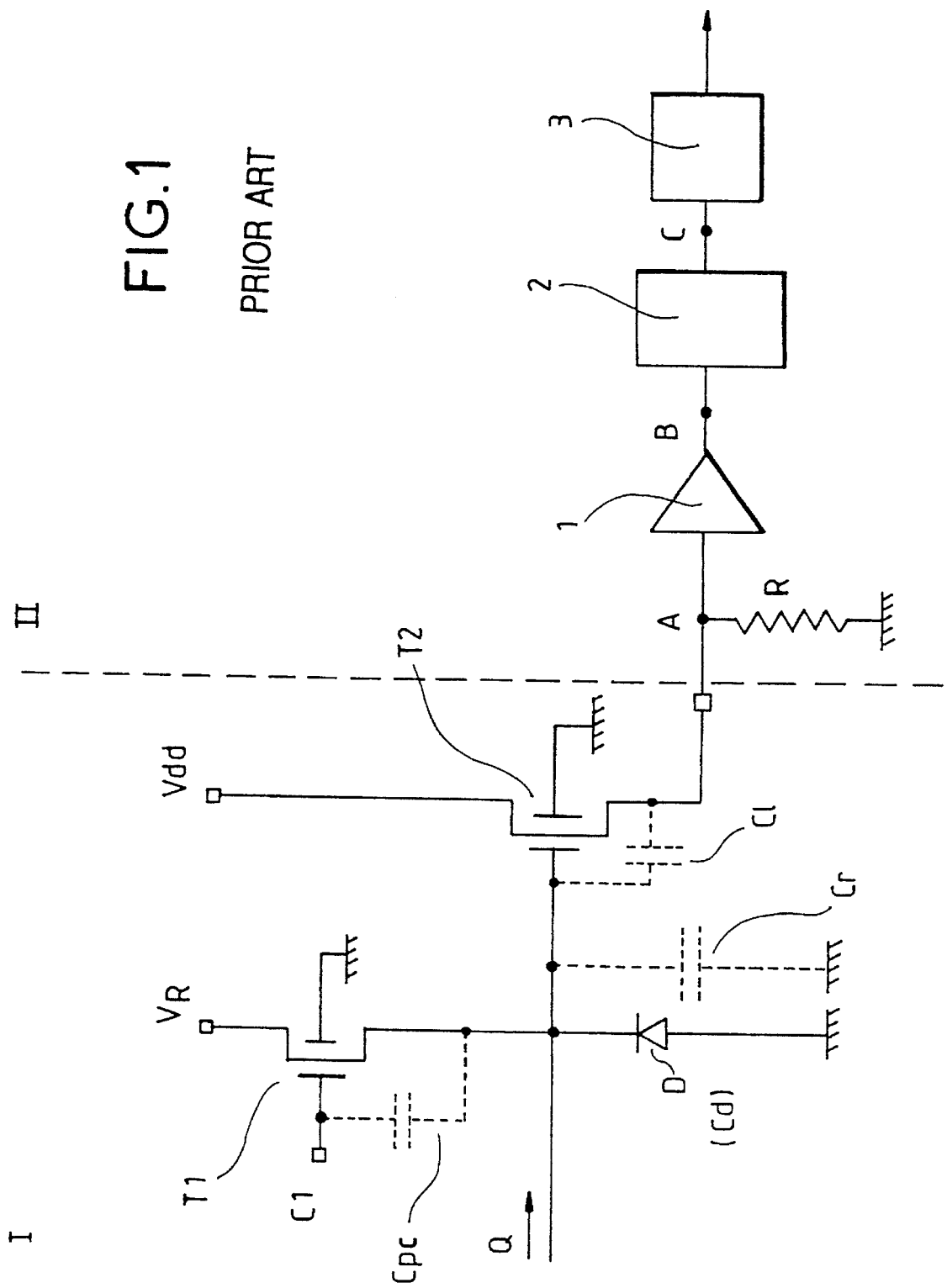
FIG. 1 represents a charge-to-voltage converter and its read chain according to the prior art.

FIG. 1 shows a charge-to-voltage converter and its read chain according to the prior art. This figure is divided into two zones I and II.

The circuits in zone I are integrated into the charge-generating component, for example a charge-transfer device. The circuits in zone II are discrete external components separate from the charge-generating component.

The charge-to-voltage converter converts the charge Q from a charge storage device (not shown in the figure) into a voltage Vs. This voltage Vs appears at the output A of the charge-transfer device.

As mentioned previously, the charge-to-voltage converter comprises a read diode and a read amplifier.

The read amplifier is in the form of a MOS transistor $T_2$ whose gate is connected to the read diode D, with the drain at a feed voltage Vdd and the source connected to the output contact A of the charge-transfer device.

The gain of the converter is adjusted using a resistance R placed between the output contact A and the ground of the device.

Professionals of the art will realize that a MOS transistor $T_1$, under the influence of the control signal C1 on its gate, enables pre-charging of the capacitor Cd of the diode D before the charge Q arrives. The drain of this transistor is connected to a feed voltage Vr, and its source is connected to the point of arrival of the charge Q, the cathode of the diode D and the gate of the transistor $T_2$.

The external read chain of the charge-transfer device comprises a high-gain amplifier 1, whose input is connected to the contact A, a low-pass filter 2 whose input is connected to the output of the amplifier 1, and a double correlated sampling circuit 3 whose input is connected to the output of the filter 2.

The low-pass filter 2 and the sampling circuit 3 are not always included in the external read chain. However, they are necessary in very low frequency applications.

As mentioned earlier, the charge conversion stage provides very low gain. Generally, it is half that of the no-load gain $G_o$, which can be about 0.85, for example.

The noise in the read chain is such that performance is mediocre since the main amplification occurs after the read amplification. This problem becomes serious in applications involving weak signals.

In FIG. 1 the parasitic capacitances Cr, Cl and Cpc are represented by hatched symbols.

The capacitance Cr represents all the overlapping capacitances around the diode D; the capacitance Cl represents the source-gate capacitance of transistor $T_2$. The Miller capacitance fed back to the input of the read amplifier of gain G is then given by Cm=Cl(1−G). The capacitance Cpc represents the source-gate capacitance of transistor $T_1$. The existence of the parasitic capacitances Cr and Cm reduces the conversion factor Fc. As we shall see later, the invention has the advantage of allowing the effect of such parasitic capacitances to be taken into account.

Figure 2:
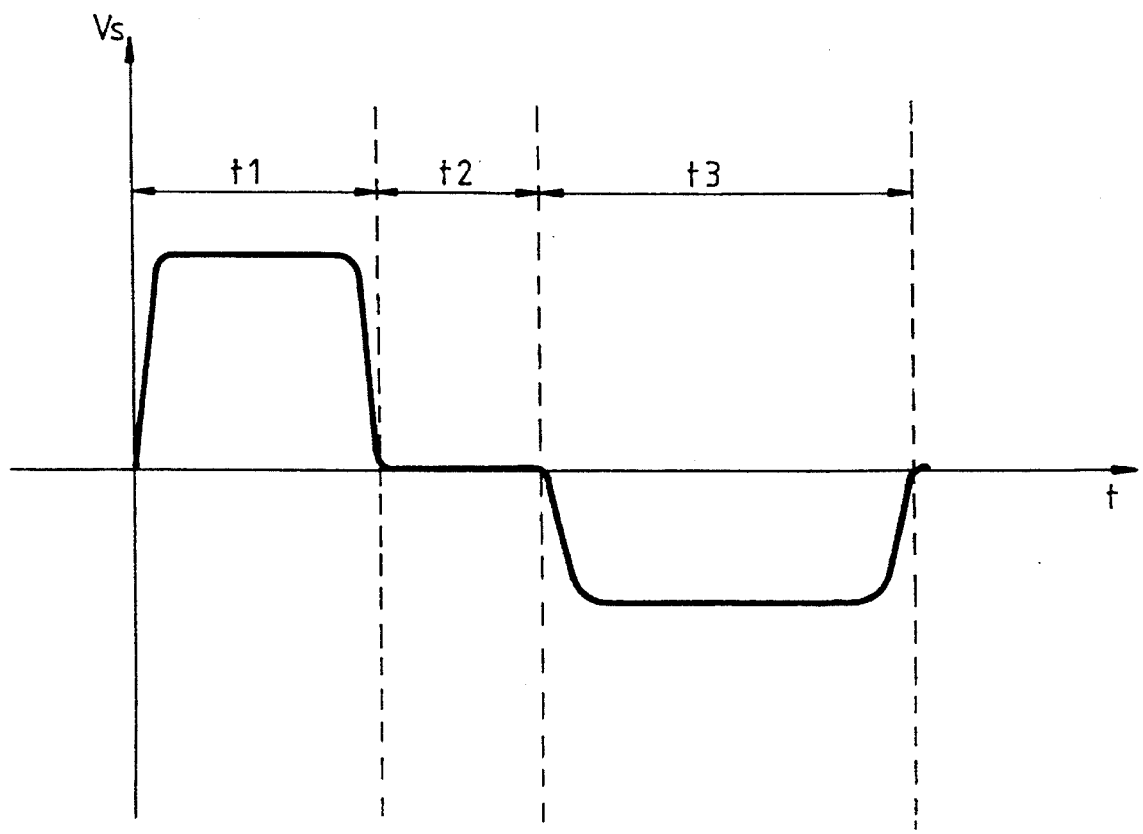
FIG. 2 shows the voltage detected by the charge-to-voltage converter as a function of time, according to the prior art.

FIG. 2 shows the voltage Vs produced by the charge-to-voltage converter as a function of time, according to the prior art.

It is possible to define three time intervals during a charge-to-voltage conversion: these are labelled $t_1$, $t_2$ and $t_3$ in FIG. 2.

The interval $t_1$ is the duration of the pre-charging of the capacitor Cd of the diode D, during which the transistor $T_1$ is conducting. The voltage Vs received during this interval $t_1$ is that appearing at the output of the read amplifier.

During interval $t_2$, the diode is floating and charges can flow.

In interval $t_3$, the wanted signal of the charge-to-voltage conversion is generated. According to the prior art, the read chain amplifies the signal that appears on the gate of transistor $T_2$ during the three intervals $t_1$, $t_2$ and $t_3$.

Thus, during interval $t_1$, if the gain of the chain is high the amplified voltage may saturate.

Owing to the intrinsic relaxation rates of the various circuits assuring the amplification in the read chain, there remains a high level of noise during intervals $t_2$ and $t_3$. It is then necessary either to limit the gain of the chain in order to avoid saturation (in which case the wanted signal is correspondingly weakened), or eliminate the feed voltage of the various amplifiers during the interval $t_3$, to suppress the amplification (in which case complementary circuits become necessary).

Figure 3:
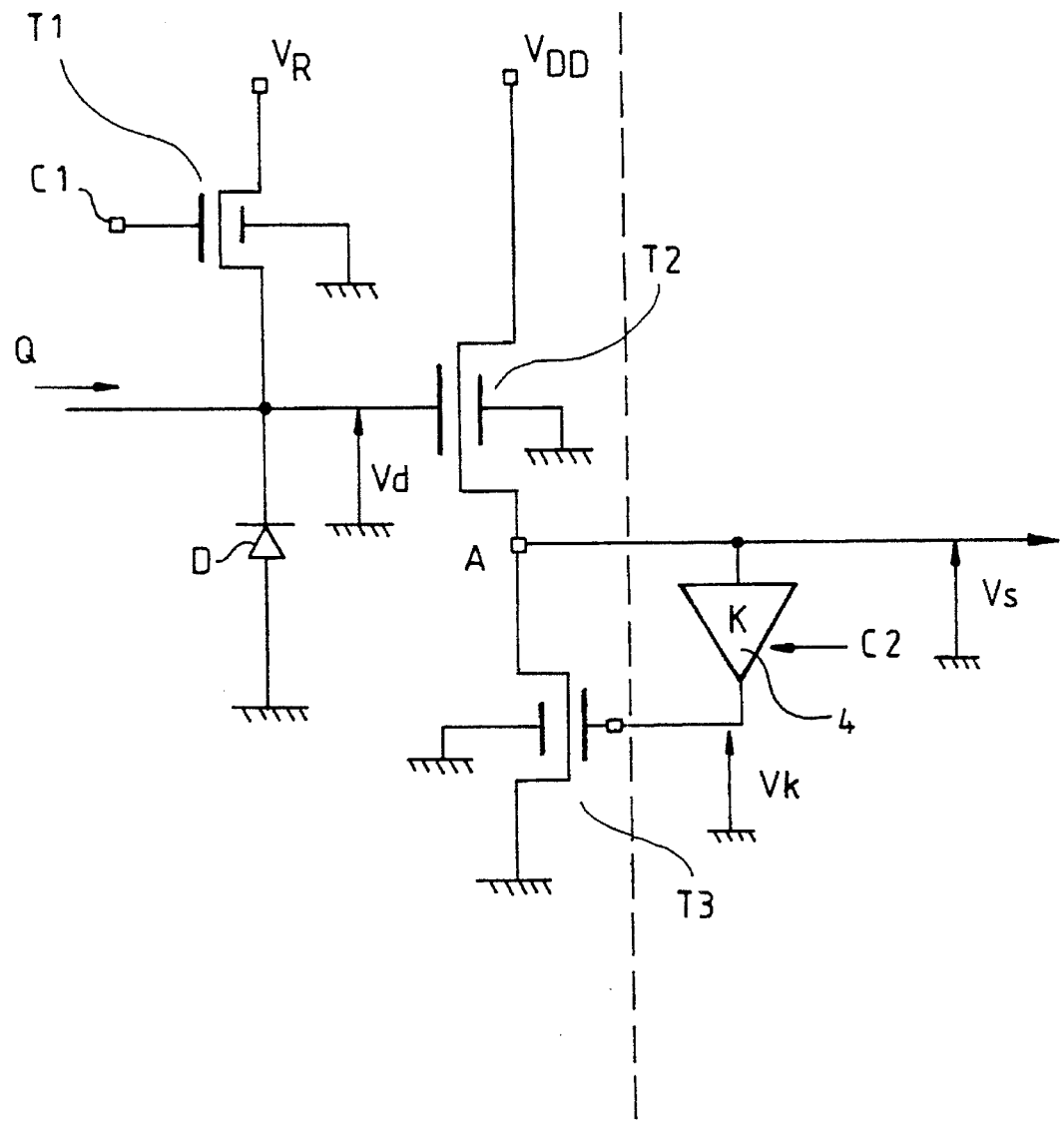
FIG. 3 represents a charge-to-voltage converter according to the preferred embodiment of the invention.

FIG. 3 represents a charge-to-voltage converter according to the preferred embodiment of the invention. Like FIG. 1, FIG. 3 is divided into two zones I and II. The circuits in zone i are integrated into the charge-generating component, and the circuits in zone II are discrete components separate from the charge-generating component. However, the invention also concerns another embodiment in which the circuits in zone II are also integrated into the charge-generating component.

Transistor $T_1$, diode D and transistor $T_2$ are connected as indicated previously.

A MOS transistor $T_3$, integrated into the charge-generating component, has its drain connected to the source of the transistor $T_2$ and its source connected to the ground of the device. An amplifier 4 of gain K, preferably in the form of a separate component external to the device, has its input connected to the source of the transistor $T_2$ and its output connected to the gate of transistor $T_3$.

As in the prior art, the output contact A of the charge-transfer device is connected to the source of transistor $T_2$ and to an external amplification chain not shown in the figure.

The read transistor $T_2$ provides a positive no-load gain $G_o$. The transistor $T_3$ behaves as an inverter: it acts as a current source whose value is advantageously adjusted by the tension applied to its gate. This enables the dynamics of the output voltage Vs to be optimally adjusted. The transistor $T_3$ mounted as an inverter has a no-load gain equal to $-G1$ (G1 being a positive value). The voltage Vd is the tension at the contacts of the diode D, and the tension Vk is that appearing at the output of the amplifier 4 of gain K. Therefore we see that:

$$Vk=K.Vs$$

and $$Vs=G_o.Vd-G_1.Vk$$

which gives:

$$Vs=G_o.Vd/(1+G_1K)$$

The gain of the read amplifier according to the invention is then given by:

$$G=G_o/(1+K.G_1)$$

The transistors $T_2$ and $T_3$ are preferably identical, in which case $G_1$ and $G_0$ will also be identical.

According to the invention, the gain K of the amplifier 4 depends on the time interval during which it amplifies. The amplifier 4 contains circuits, which need not be described here, that enable the gain to be varied as a function of a control signal C2.

Figure 4:
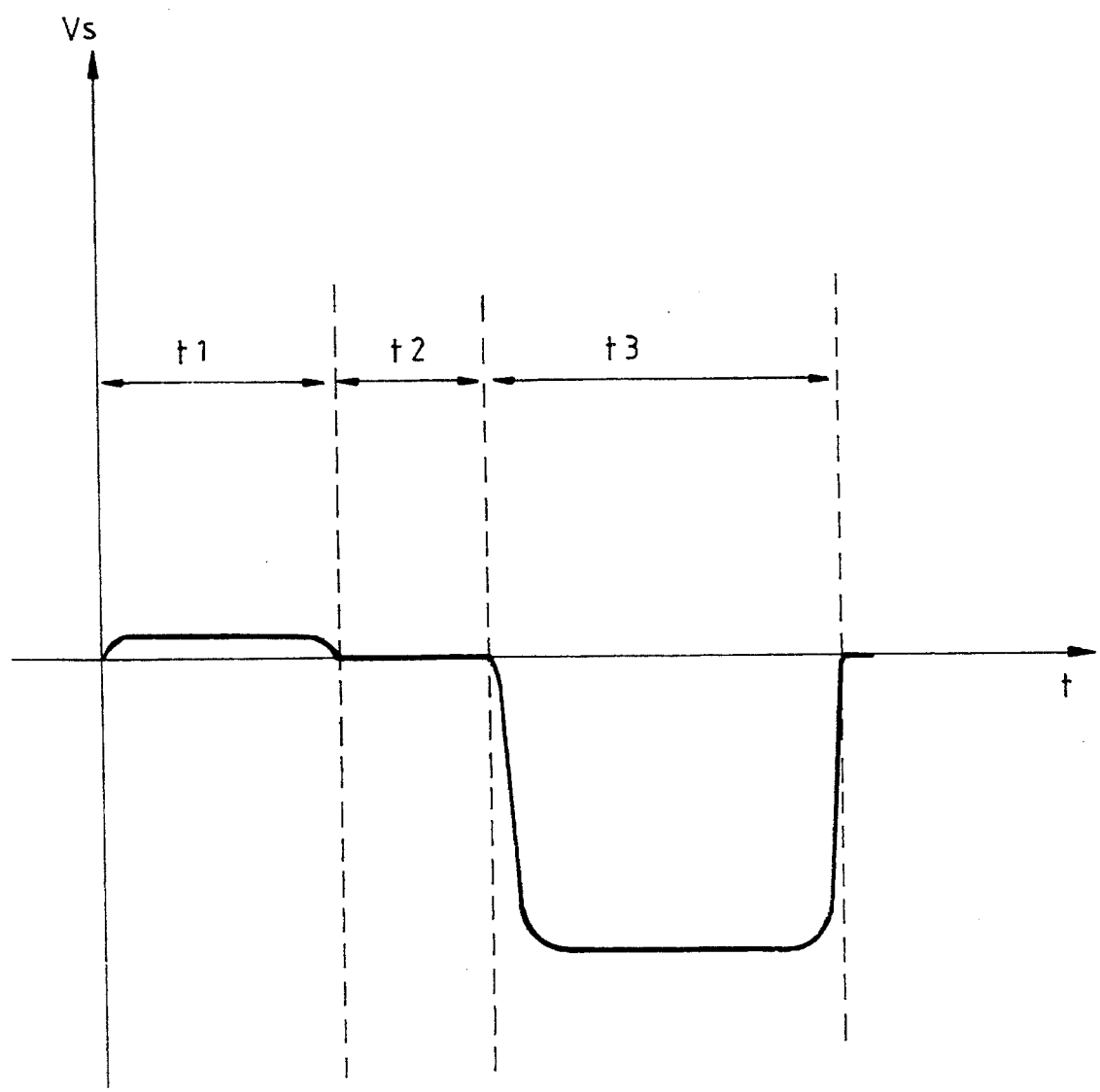
FIG. 4 shows the tension detected by the charge-to-voltage converter as a function of time, according to the preferred embodiment of the invention.

FIG. 4 shows the voltage detected as a function of time by the charge-to-voltage converter in the preferred embodiment of the invention.

During the interval $t_1$ the gain K of amplifier 4 has a high positive value, for example K=10. The gain G then becomes substantially equal to 1/K, which is close to zero. The voltage Vs detected at the output contact A of the converter is therefore also very low.

Consequently, the amplification of the read chain is no longer limited as in the prior art.

During the interval $t_2$ and $t_3$ the gain K becomes slightly negative in order to ensure that gain G is greater than gain $G_o$. G is preferably greater than 1. The value of K can be about −0.2, for example. The value Vs detected is then advantageously much higher than in the prior art. As we have shown earlier, the conversion factor can be written:

$$Fc=G/(Cd+Cr+Cm)$$

where $Cm=(1-G).Cl$ Therefore we obtain:

$$Fc=G/(Cd+Cr+(1-G)Cl)$$

The conversion factor is improved not only by the increase in the gain G but also by the effect, according to the invention, of the Miller capacitance Cm: for values of G between Go and 1, Cm is reduced; for G=1, Cm cancelled; for G>1, Cm takes negative values enabling the effect of capacitances Cd and Cr to be compensated.

One advantage of the invention is therefore the use of the Miller capacitance Cm to increase the conversion factor.

In the prior art the effect of the Miller capacitance reduces the conversion factor. Therefore it is necessary to reduce the value of this capacitance. Professionals of the art know that to achieve this the transistor $T_2$ must be of small size. However, the result of this is a deterioration of the linearity of the potential applied under the control gate of the transistor, which in turn results in a degradation of the output voltage Vs characteristics. The present invention avoids this disadvantage.

Another advantage of the invention is that it is possible to use a read transistor $T_2$ whose gate-source capacitance Cl is greater than that of a read transistor according to the prior art. The dimensions of such a transistor can then be greater than those of transistors used in the prior art, thus providing better dynamics of the output voltage Vs.

What is claimed is:

1. A charge-to-voltage converter including a read diode, across which a first voltage appears, and a read transistor whose no-load gain is $G_o$ and whose gate is connected to said read diode, such that said first voltage is applied to said gate, and whose source is the point at which the output voltage of said converter is produced, and wherein said charge-to-voltage conversion is carried out in three time intervals, a first interval during which the capacitance of the diode is pre-charged, a second interval during which the diode is floating, and a third interval during which the signal resulting from the charge to voltage conversion is read, said converter also including means of controlling the gain G of said output voltage over said first voltage, such that gain G is substantially equal to zero during the first interval and greater than gain $G_o$ during the second and third intervals, wherein said means of controlling the gain G are an amplifier providing a gain K and a transistor connected as a inverter providing a no-load gain equal to $-G_1$, this amplifier having its input connected to a point at which the output voltage is collected and its output connected to the gate of said transistor connected as an inverter, this transistor having its drain connected to the input of the amplifier and its source connected to the ground of the device, such that the gain G of the device is given by:

$$G=G_o/(1+K.G_1)$$

2. Device according to claim 1, wherein said amplifier providing gain K includes circuits enabling, under the effect of a control signal, this gain K to be made negative during the second and third intervals, so that the gain G becomes greater than $G_o$, and this gain K to be made positive during the first interval so that the gain G becomes substantially equal to zero.

3. Device according to claim 2, wherein said read transistor and said transistor connected as an inverter are MOS transistors.

4. Device according to claim 3, wherein said read transistor and said transistor connected as an inverter are identical, so that gain $G_1$ is equal to gain $G_o$.

5. Device according to claim 4, wherein gain $G_o$ is substantially equal to 0.85, and gain K is substantially equal to $-0.2$ during the second and third intervals and substantially equal to 10 during the first interval.

6. A charge to voltage converter including a read diode, across which a first voltage appears, and a read transistor the no-load gain of which is $G_o$, said transistor having a gate connected to said read diode, such that said first voltage is applied to said gate and a source connected to a load transistor and to an output node, and wherein said charge to voltage conversion is carried out in three time intervals, a first interval during which the diode is precharged, a second interval during which the diode is floating, and a third interval during which a read voltage resulting from a charge-to-voltage conversion is produced at said output node, said converter further comprising a feedback loop between said output node and a gate of said load transistor for controlling the gain G of said output node voltage over said first voltage.

7. A device according to claim 6, wherein said feedback loop comprises an amplifier having a controllable gain K.

8. A device according to claim 7, comprising means for controlling the gain K of the amplifier, said means including circuits enabling, under the effect of a control signal, this gain K to be made negative during the second and third time intervals.

9. A device according to claim 8, wherein said means for controlling the gain K are adapted for adjusting the gain G to a value which is much lower during the first time interval than during the second and third time intervals.

10. A device according to one of claims 8 and 9 wherein the means for controlling the gain K are adapted for rendering the gain K positive during the first interval of time.

11. A device according to one of claims 8 and 9 wherein said load transistor has a gain $-G_o$.

12. A device according to claim 11, wherein gain $G_o$ is approximately equal to 0.85, and gain K is approximately equal to $-0.2$ during the second and third intervals and approximately equal to 10 during the first interval.

* * * * *